United States Patent
Nakayama et al.

(10) Patent No.: US 6,777,693 B2
(45) Date of Patent: Aug. 17, 2004

(54) LITHOGRAPHIC METHOD USING ULTRA-FINE PROBE NEEDLE

(75) Inventors: Yoshikazu Nakayama, 9-404, 14-2, Korigaoka 1-chome, Hirakata-city, Osaka 573-0084 (JP); Akio Harada, Osaka (JP)

(73) Assignees: Yoshikazu Nakayama, Osaka (JP); Daiken Chemical Co., Ltd., Osaka (JP)

( * ) Notice: Subject to any disclaimer, the term of this patent is extended or adjusted under 35 U.S.C. 154(b) by 42 days.

(21) Appl. No.: 09/915,618

(22) Filed: Jul. 26, 2001

(65) Prior Publication Data

US 2003/0020025 A1 Jan. 30, 2003

(51) Int. Cl.[7] .............................................. H01J 37/317
(52) U.S. Cl. .................................................. 250/492.2
(58) Field of Search ..................................... 250/492.2

(56) References Cited

U.S. PATENT DOCUMENTS 4,464,460 A * 8/1984 Hiraoka et al. ............. 430/323
6,078,055 A * 6/2000 Bridger et al. ............ 250/492.2
6,146,227 A * 11/2000 Mancevski .................... 445/24
6,166,386 A * 12/2000 Yano et al. ............... 250/492.2
6,306,779 B1 * 10/2001 Muehl et al. ................ 438/795

FOREIGN PATENT DOCUMENTS

| JP | 2000405558 A | * | 11/2000 | .......... G01N/13/16 |
| JP | 2000346788 A | * | 12/2000 | .......... G01N/33/16 |
| JP | 2001198900 A | * | 7/2001 | ............. B82B/3/00 |
| JP | 2002162335 A | * | 6/2002 | .......... G01N/13/16 |

* cited by examiner

Primary Examiner—Stephen D. Meier
Assistant Examiner—Alfred Dudding
(74) Attorney, Agent, or Firm—Koda & Androlia

(57) ABSTRACT

A lithographic method using an ultra-fine probe needle in which a base end of a nanotube is fastened to a holder with the tip end of the nanotube protruded from the holder. The tip end of the thus obtained nanotube probe needle is brought to contact a sample surface, a voltage is applied across the probe needle and sample, and the probe needle is moved while the sample substance in the area of contact of the probe needle is removed by the application of the voltage, thus forming a groove-form pattern on the sample surface.

6 Claims, 11 Drawing Sheets

LITHOGRAPHIC METHOD USING ULTRA-FINE PROBE NEEDLE

BACKGROUND OF THE INVENTION

1. Field of the Invention

The present invention relates to a lithographic method that forms ultra-fine groove-form patterns in samples of electrical functional films, optical functional films, resist films, mask-forming films, and the like and more particularly to lithographic method using an ultra-fine probe needle capable of ultra-fine working, which uses an AFM cantilever, nanotube, etc., with a nano-size tip end diameter as a probe needle and forms groove-form patterns with an extremely small groove width in samples.

2. Prior Art

Generally, a lithographic method utilizing a photoresist and a mask (also called an exposure image-drawing method) is used in order to form circuit patterns on semiconductor chips. In this lithographic method, as shown in FIG. 16, a wafer is cut from a single crystal in steps (a) and (b). This wafer is used as a substrate 100, and in step (c) a photoresist is dropped onto this substrate 100 while the substrate is rotated on a spinner, thus forming a photoresist film 102 on the surface of a substrate 100 in step (d).

A mask 104 corresponding to a photographic negative is superimposed on the surface of this photoresist film 102 in step (e), and the photoresist film 102 is exposed from above. The mask 104 is formed by patterning opaque parts 108 in a substrate film 106. These opaque parts 108 prevent the photoresist film 102 from sensing light. When developed, the exposed parts 110 are removed in step (f), while the unexposed parts 112 remain. Conversely, there may be cases in which the unexposed parts are removed. Next, a diffusion layer 114 is formed in the exposed parts 110 by means of a diffusion treatment in step (g), and the unexposed parts 112 are removed in step (h), so that the semiconductor chip 116 is completed. Complex semiconductor patterns are formed by repeating these steps.

Since light is utilized in such an exposure system, the light that passes through the mask is diffracted in the areas of the opaque parts, thus lowering the resolution of the pattern. As the pattern of the mask becomes finer, this diffraction is increased, so that the resolution drops even more abruptly. Techniques in which the exposure wavelength is shortened have been developed in order to increase the resolution. First, development moved from the near ultraviolet of ultra-high-pressure mercury lamps to the far ultraviolet of excimer lasers. However, even in the case of promising excimer laser exposure, the resolution is only about 300 to 400 nm. In semiconductors, there is a demand for further increases in density and speed, and ultra-fine working in the range of 1 nm to 100 nm is impossible using conventional methods.

Accordingly, X-ray exposure techniques utilizing X-rays with a wavelength of approximately 0.1 nm have come to the fore. Although there are no problems in terms of obtaining a high resolution, lenses cannot be used for the directional control of X-rays, and reflection control by means of concave surfaces or convex surfaces is also difficult. Furthermore, there are also problems in terms of the parallel orientation of X-rays. In cases where an ordinary electron beam excitation mode is used as an X-ray source, the intensity of the X-rays is weak. On the other hand, in the case of a plasma X-ray source or SOR light source, the scale of the apparatus is large, so that adaptation for practical use is difficult.

Electron beam exposure has been developed in order to solve such difficulties. Since electron beams have a short wavelength, the resolution is extremely high, and such systems have good operability, as in the case of electron microscopes. On the other hand, however, such systems are inconvenient in that the exposure treatment must be performed in a vacuum. Electron beams also suffer from a drawback in that such beams are scattered in a photoresist, so that the electron beam itself spreads. Furthermore, in the case of electron beams, the energy of the electrons is high; accordingly, such a technique also suffers from the drawback of creating defects in the semiconductor that is worked.

SUMMARY OF THE INVENTION

Accordingly, the object of the present invention is to provide a lithographic technique with a high resolution that is completely separate from the concept of conventional exposure treatments using electromagnetic waves or electron beams and makes it possible to draw ultra-fine groove patterns with a groove width of several nanometers to several hundred nanometers on samples such as high-function films, resist films and mask-forming films, etc.

The above object is accomplished by unique steps of the present invention for a lithographic method that forms groove-form patterns on a sample surface (or on a surface of an object), and the unique steps of the present invention comprises the steps of:

causing a tip end of a probe needle to contact a surface of a sample (or an object) either continuously or intermittently, the probe needle being an ultra-fine probe needle with a nano-size tip end diameter, applying a voltage across the probe needle and sample, and causing the probe needle to move while removing a substance that makes the sample at a probe needle contact area by an application of said voltage.

In this method, the ultra-fine probe needle is a nanotube probe; and this nanotube probe is obtained by fastening a base end portion of a nanotube to a holder with a tip end portion of the nanotube being caused to protrude from the holder.

In this nanotube probe, the holder is a pyramid portion of a cantilever for AFM use. The pyramid portion is a portion protruding from the cantilever and the shape of the pyramid is free and contains all desired protruding shapes.

Also, the sample or an object on which the groove-form patterns are made is a lithographable matter such as an organic film, other organic matter and an inorganic matter, and a voltage is applied across the probe needle and this organic film so that the probe needle is used as a cathode.

In the method of the present invention, the groove width and groove depth of the groove-form pattern are controlled by adjusting the scanning speed of the probe needle and the applied voltage.

Furthermore, the organic film can be an electrical or optical functional film, a mask-forming film, or a resist film formed on a substrate. Also, the organic film can be a polysilane film.

DETAILED DESCRIPTION OF THE INVENTION

Figure 1:
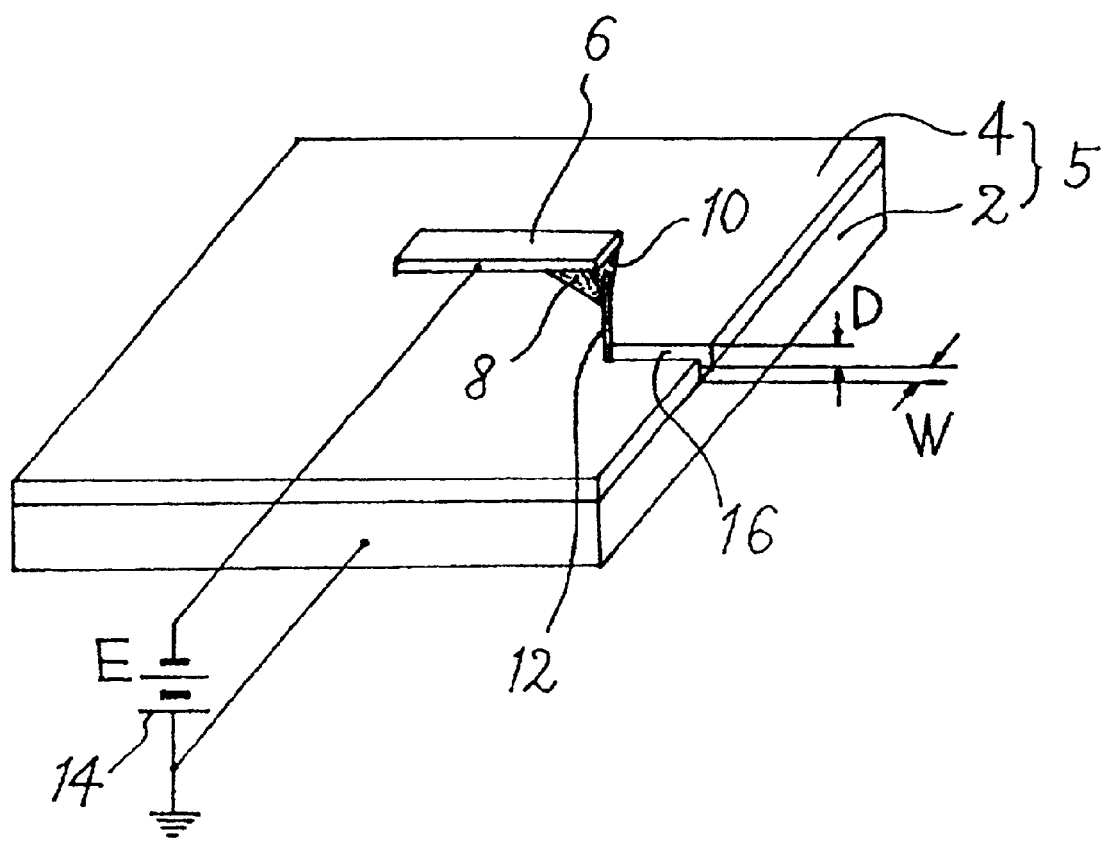
FIG. 1 is a schematic perspective view of the formation of a groove pattern in an organic film according to the present invention.

In order to develop lithographic techniques with a resolution that allows a groove width of several nanometers to several hundred nanometers, attention has been focused on the utilization of nanotube probe needles, AFM probe needles and STM probe needles, etc., with an emphasis on carbon nanotubes, and nano-scale lithographic techniques (hereafter referred to as "nano-lithography") have now been realized. In particular, it has now been concluded that nanotube probe needles have the highest resolution as a result of their extremely small tip end curvature radius.

The present inventors have already disclosed SPM (scanning probe microscopes) devices, e.g., AFM (atomic force microscopes) devices and STM (tunnel microscopes) devices in Japanese Patent Application Nos. H10-376642, H10-378548, H 11-116939 and H11-116940.

The reasons for the preeminence of nanotubes as lithographic probe needles are as follows: specifically, nanotubes were first discovered as carbon nanotubes. Carbon nanotubes (also called "CNT") have diameters ranging from approximately one (1) nanometer to several tens of nanometers. Furthermore, the axial lengths of such nanotubes range from nano-size to micro-size. Accordingly, if nanotubes with such a high aspect ratio are used as SPM probe needles, the surface structures of samples can be detected with a high resolution on the atomic level.

Following the discovery of carbon nanotubes, BCN (Boron Carbon Nitride) type nanotubes were synthesized. For example, a mixed powder of amorphous boron and graphite is packed into a graphite rod, and is evaporated in nitrogen gas. Alternatively, a sintered BN (Boron Nitride) rod is packed into a graphite rod, and is evaporated in helium gas. As still another alternative, $BC_4N$ (Boron 4-Carbon Nitride) is formed into an anode, graphite is used as a cathode, and an arc discharge is performed in helium gas. BCN type nanotubes in which some of the C (Carbon) atoms in CNT are replaced by B atoms and N atoms have been synthesized by these methods.

Furthermore, BN (Boron Nitride) type nanotubes have also been synthesized. These are nanotubes that contain almost no C atoms. For example, CNT and powdered $B_2O_3$ are placed in a crucible and heated in nitrogen gas. As a result, a BN type nanotube in which almost all of the C atoms in the CNT are replaced by B atoms and N atoms is synthesized.

Both BCN type nanotubes and BN type nanotubes have material structures that are more or less similar to that of CNT; as a result, the ratio of the axial length to the diameter, i.e., the aspect ratio, is extremely high. Accordingly, not only carbon nanotubes, but also nanotubes in general such as BCN type nanotubes and BN type nanotubes, etc., can be used as the nanotube of the present invention. However, surface coating and doping of the metal surface may be performed in order to ensure electrical conductivity.

Assuming that nanotubes can not only detect indented and projecting structures in sample surfaces, but also remove atoms from the sample surfaces, then it should be possible to form grooves by moving and removing atoms from the surfaces of samples by means of nanotubes, thus making it possible to draw patterns consisting of grooves. Furthermore, the groove width in this case depends on the diameter of the nanotube used; if a nanotube with a diameter of 1 nm is used, then it should be possible to reduce the groove width to an extremely small value of around a few nanometers at the smallest. The lithographic method using an ultra-fine probe needle provided by the present invention was realized on the basis of this idea.

Probe needles used for ultra-fine working are not limited to nanotubes; AFM cantilevers and STM probe needles can also be used. Since these probe needles are small enough to image the distribution of atoms on sample surfaces, these needles can also form groove patterns on the nano-scale when used as lithographic probe needles. The following description will use the most effective nanotube probe needles as an example; however, this description can also be applied to the other probe needles mentioned above.

Next, the inventors investigated methods for removing atoms by means of nanotubes.

Utilizing the AFM contact mode or tapping mode, a nanotube was caused to contact a sample surface, and the nanotube probe needle was moved while a voltage was applied across the nanotube and sample. When this surface was observed in AFM mode, grooves were confirmed on the surface of the sample or the object.

The sample on which the present invention is applied contains all substances that are lithgraphable by the present invention; and especially the sample includes inorganic matters and organic matters.

In cases where the sample consists of an organic substance such as an organic polysilane, grooves are formed on the sample surface when a voltage is applied across the nanotube and sample so that the nanotube is caused to act as a cathode. Furthermore, since grooves are formed when a current flows, it appears that the Si—Si bonds are broken by electron injection, and that atoms or groups of atoms that are thus cut are released into space.

If a resist film is used as the sample, any desired groove pattern can be cut in this resist film, and nano-lithography with a groove width of several nanometers to several tens of nanometers can be realized depending on the diameter of the nanotube. Furthermore, in cases where a mask is used as the sample, a mask can be realized by coating a substrate film with an opaque film, and then forming a groove pattern in this opaque film by means of a nanotube. Furthermore, in cases where an electrical functional film or optical functional film is used as the sample, any desired pattern can be formed, so that nano-scale devices can be manufactured. In addition, nano-lithography has been perfected in which any type of film may be used as a sample, and in which nano-scale groove patterns can be formed in this sample.

Next, embodiments of the lithographic method using an ultra-fine probe needle of the present invention will be described in detail with reference to the accompanying drawings.

FIG. 1 is a schematic perspective showing the formation of a groove pattern in an organic film. The reference numeral 2 is a substrate consisting of single-crystal silicon, and an organic film 4 consisting of an organic substance is formed on the surface of the substrate 2. A sample 5 consists of the substrate 2 and organic film 4. The reference numeral 6 is an AFM cantilever, 8 is a pyramid-form holder formed from silicon, and 10 is a metal film consisting of Au, etc., which is vacuum-evaporated on the surface of the holder 8. A nanotube 12 is fastened to the surface of the holder 8. The reference numeral 14 is a DC power supply.

The cathode of the DC power supply 14 with a voltage of E is connected to the cantilever 6, so that the metal film 10 of the holder 8 is formed into a cathode via a conductive film. Furthermore, the anode of the DC power supply 14 is connected to the substrate 2 and grounded. Accordingly, a negative voltage –E (V) is applied to the holder 8 relative to the substrate 2 which is at 0 (V). This E (V) is called "bias voltage". When the cantilever 6 is moved in this state, i.e., in the contact mode, the atoms forming the organic film at the tip end of the nanotube probe needle 12 are released into space, so that a groove 16 with a groove depth of D and a groove width of W is formed in the organic film 4.

Figure 2:
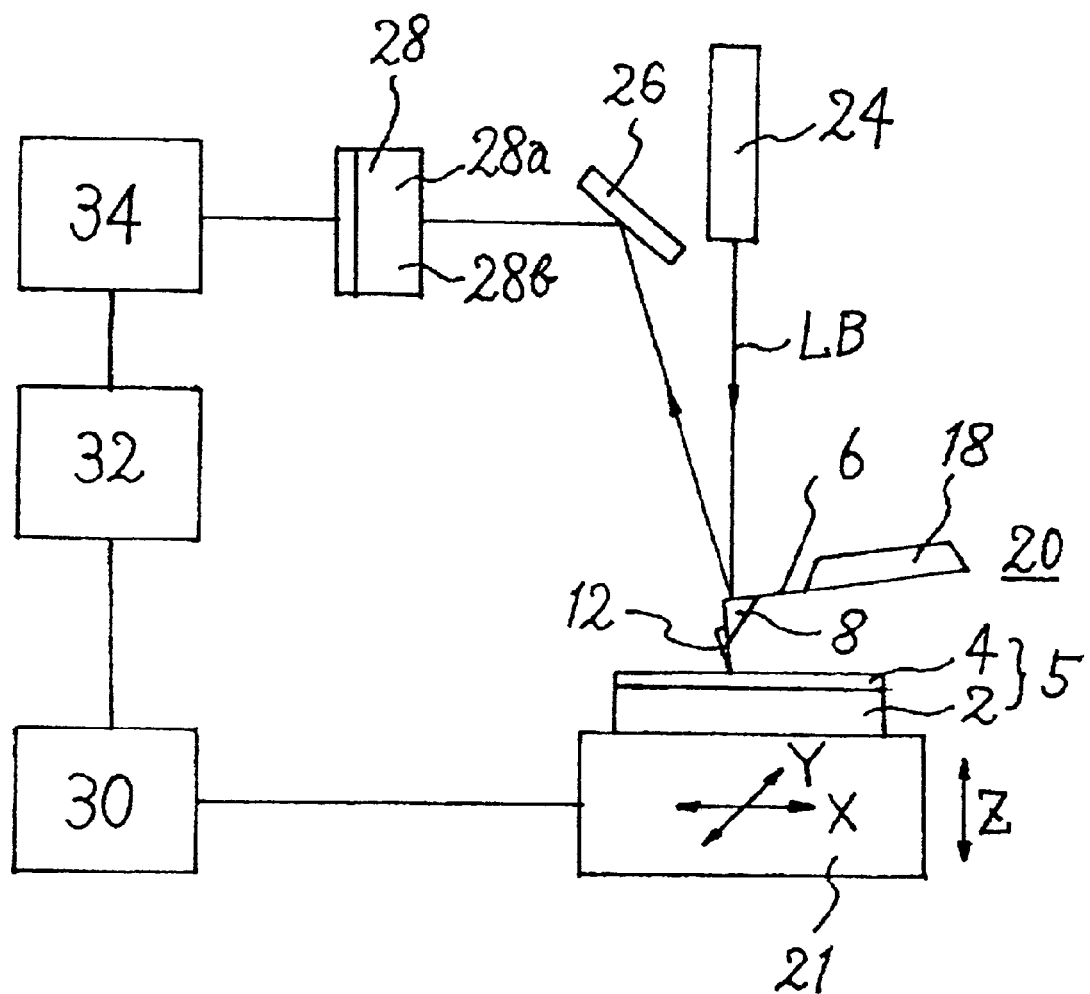
FIG. 2 is a control diagram showing the control of the movement of the nanotube probe needle.

FIG. 2 is a diagram showing the control of the movement of the nanotube probe needle. The nanotube probe needle 12 is fastened to a pyramid-form holder 8, and this holder 8 is disposed on the tip end of the cantilever 6. A substrate 18 is disposed behind the cantilever 6. The cantilever 6, holder 8, nanotube probe needle 12 and substrate 18 are integrated to form a nanotube probe 20.

A sample 5 is placed on a sample stand 21. The sample 5 is driven in the X, Y and Z directions by an XYZ scanning circuit 30. In FIG. 2, the reference numeral 24 is a semiconductor laser apparatus, 26 is a reflective mirror, 28 is a two-section light detector, 32 is an AFM display device, and 34 is a Z-axis detection circuit.

The nanotube probe needle 12 is moved in the Z direction until the needle 12 contacts the surface of the sample 5. The laser beam LB from the semiconductor laser apparatus 24 is directed onto the back surface of the cantilever 6, and the reflected light of this laser beam is again reflected by the reflective mirror 26, so that the light is caused to be incident on the two-section light detector 28. To describe FIG. 2 in terms of an AFM device, the cantilever 6 is displaced upward and downward as the nanotube probe needle 12 is scanned in the X and Y directions, and the amount of displacement of the cantilever 6 in the Z direction is detected from the difference in the quantities of light detected by the detectors 28a and 28b. The amount of Z axis displacement is calculated by a Z axis detection circuit 34, and this amount of Z axis displacement is displayed by an AFM display device 32.

In the present invention, the sample 5 is moved in the X and Y directions while the nanotube probe needle 12 is caused to contact the surface of the organic film 4 either continuously or intermittently, thus forming the groove 16 shown in FIG. 1. The voltage E applied to the nanotube and the movement speed in the X and Y directions may be adjusted in order to obtain the desired groove width W and groove depth D.

Figure 3:
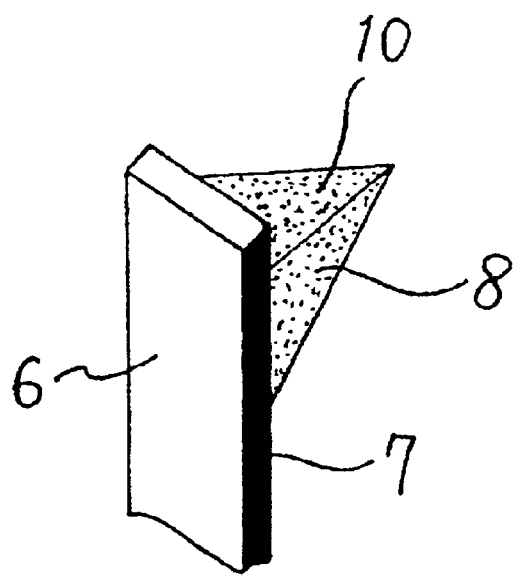
FIG. 3 is a perspective view of the essential portion of a cantilever for AFM use.

FIG. 3 is a perspective view of the essential portion of the AFM cantilever. An electrode 7 is formed on the side surface of the cantilever 6, and a metal film 10 consisting of Au, etc., is formed on the surface of the pyramid-form holder 8. The electrode 7 and metal film 10 are in an electrically continuous state. Since silicon is highly insulating, a metal film is formed on the surface of the holder 8 so that a voltage can be applied.

Figure 4:
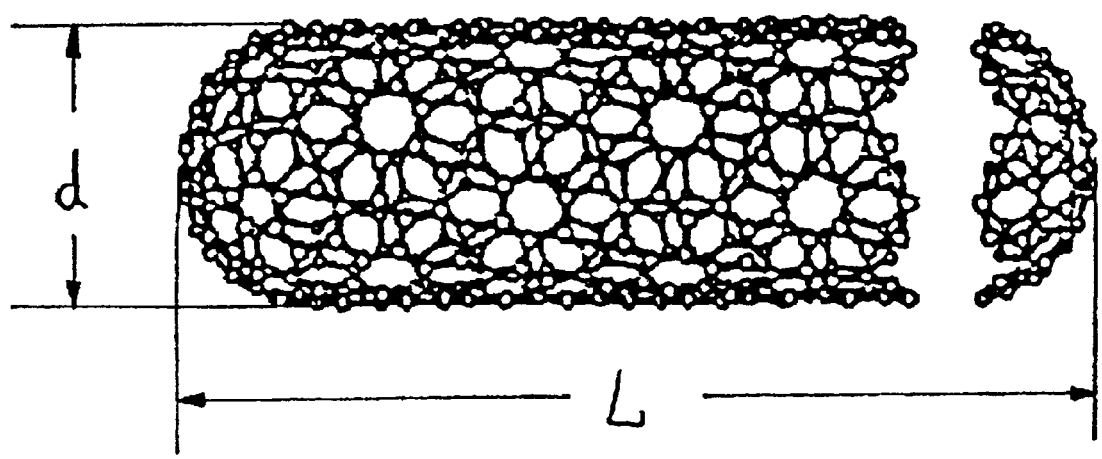
FIG. 4 is a perspective view of a nanotube.

As seen from FIG. 4, a perspective view of the nanotube, the diameter d of a nanotube ranges from approximately one (1) nanometer to several tens of nanometers, and the axial length L ranges from several hundred nanometers to several microns. Accordingly, the aspect ratio L/d ranges from 10 to several thousand, so that a nanotube with any desired aspect ratio can be selected. Currently, no other comparable material exists.

Figure 5:
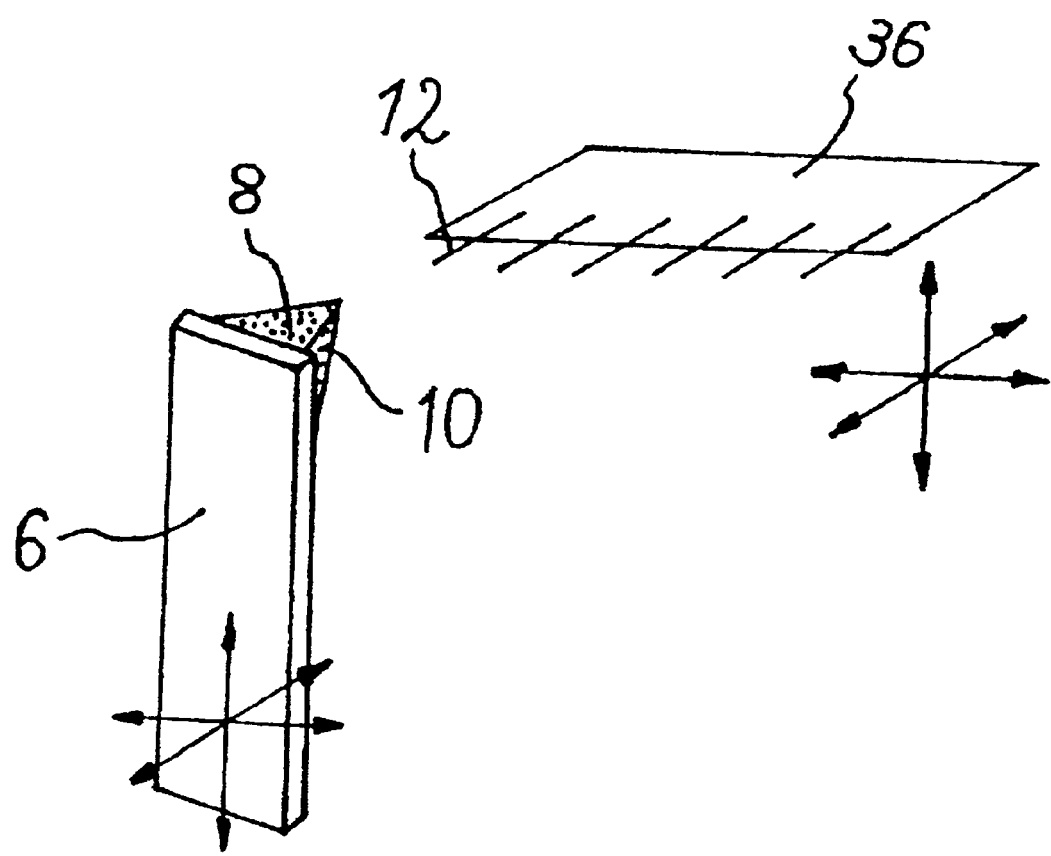
FIG. 5 is a process diagram in which the nanotube is fastened to the holder.
Figure 6:
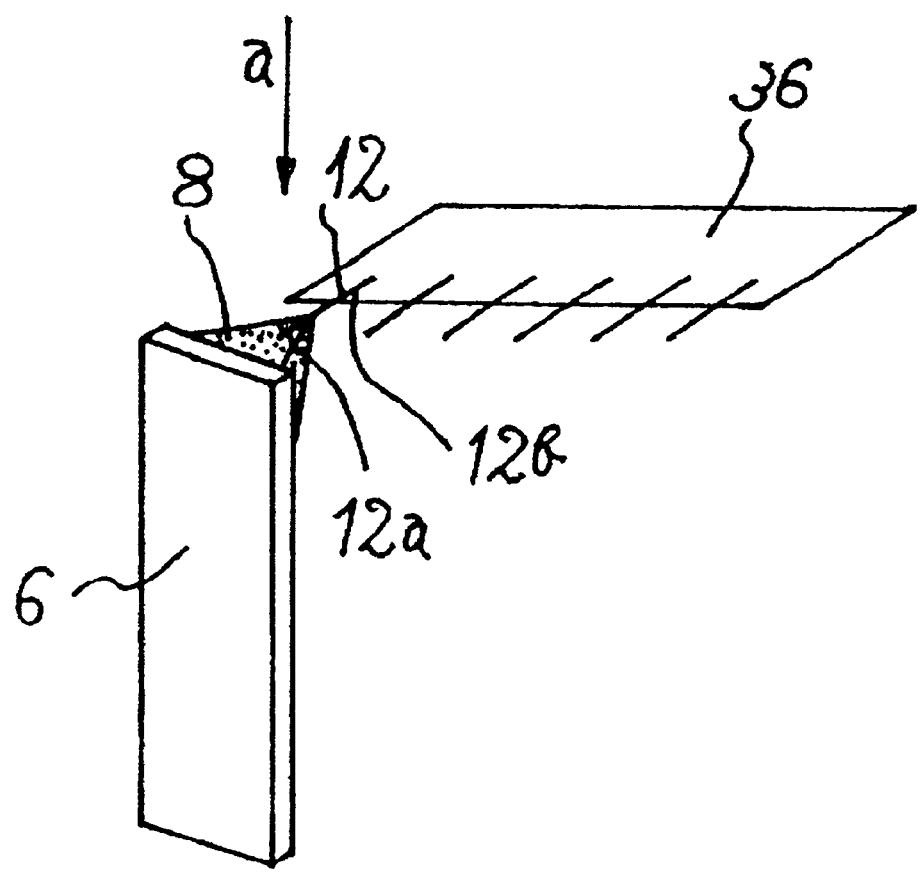
FIG. 6 is a process diagram in which the nanotube is fastened to the holder.
Figure 7:
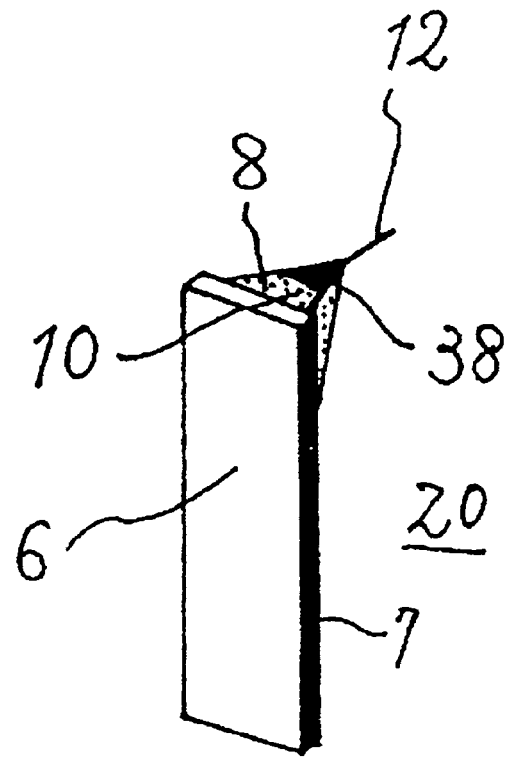
FIG. 7 is a process diagram in which the nanotube is fastened to the holder.

FIGS. 5 through 7 are process diagrams illustrating the fastening of the nanotube 12 to the holder 8.

Nanotubes 12 are attached to a knife edge 36 in a semi-protruding state by means of a non-uniform electric field. As shown in FIG. 5, this knife edge 36 and the AFM cantilever 6 on which a metal film 10 has been formed are positioned facing each other inside an electron microscope. The system is constructed so that the knife edge 36 and cantilever 6 can be independently moved and adjusted in three dimensions.

As shown in FIG. 6, the cantilever 6 is moved, and a fine adjustment is made so that one nanotube 12 contacts the surface of the holder 8. More specifically, the base end portion 12a of the nanotube 12 contacts the holder 8, while the tip end portion 12b of the nanotube 12 protrudes from the holder 8. When the base end portion 12a is irradiated with an electron beam, organic impurities present in trace amounts inside the electron microscope are decomposed, thus causing a coating film 38 consisting of carbon to be formed so that this film covers the base end portion 12a. A cantilever 6 which has a nanotube probe needle 12 fastened in place by such a coating film 38 is shown in FIG. 7.

Figure 8:
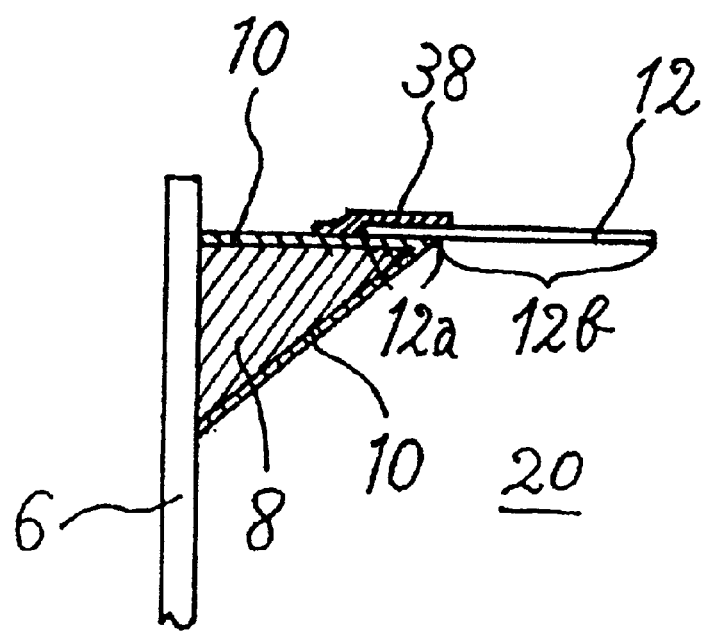
FIG. 8 is a sectional view of the essential portion in FIG. 7.

FIG. 8 is a sectional view of the essential portion shown in FIG. 7. It is seen that a metal film 10 is formed on the surface of the pyramid-form holder 8, and that the base end portion 12a of the nanotube 12 is fastened in place by means of a coating film 38. The tip end portion 12b of the nanotube 12 functions as a probe needle.

Figure 9:
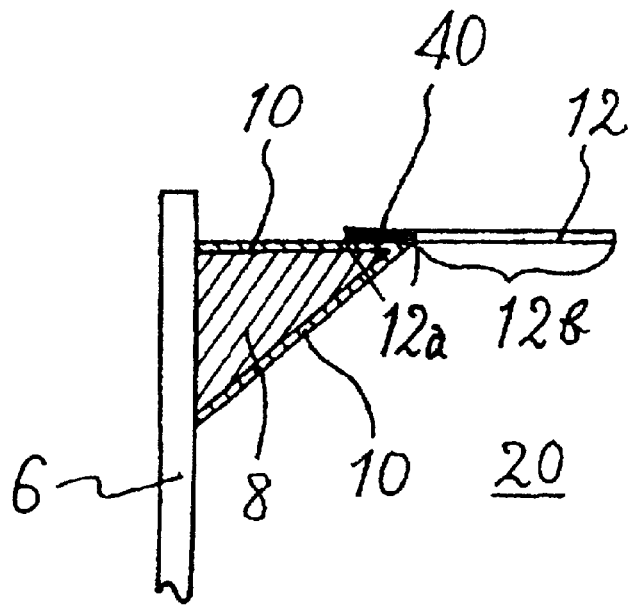
FIG. 9 is a sectional view of another method of fastening the nanotube.

FIG. 9 is a sectional view of essential portion that illustrates another method for fastening the nanotube. When a current is caused to flow between the knife edge 36 and the holder 8 in the state shown in FIG. 6, the base end portion 12a of the nanotube 12 is converted into an amorphous state and fused to the holder 8. Such fusion can also be accomplished by direct irradiation with an electron beam. Accordingly, the base end portion 12a becomes a fused portion 40 consisting of an amorphous structure. The nanotube 12 is firmly fastened to the holder by this fused portion.

Figure 10:
FIG. 10 is a photograph of a nanotube probe in which the nanotube is fastened in place by means of a coating film.

FIG. 10 is a photograph of a nanotube probe in which the nanotube is fastened in place by means of a coating film. Since the nanotube 12 is thus fastened, the nanotube 12 does not easily come loose from the holder 8. Since the nanotube 12 consists of an extremely pliable material, this nanotube is capable of extreme bending without breaking. Here, the nanotube is bent and fastened so that the tip end of the nanotube contacts the sample surface more or less perpendicularly. Accordingly, a nanotube probe 20 manufactured in this manner is highly durable, and has a long useful life.

Figure 11:
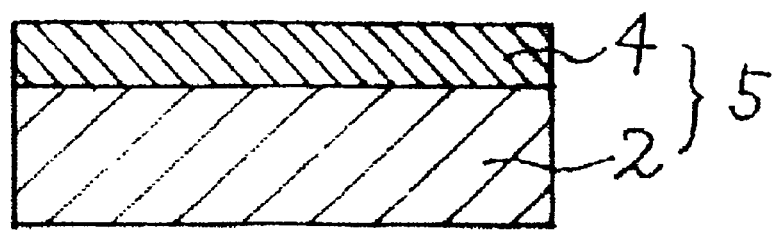
FIG. 11 is a sectional view of a sample.
Figure 12:
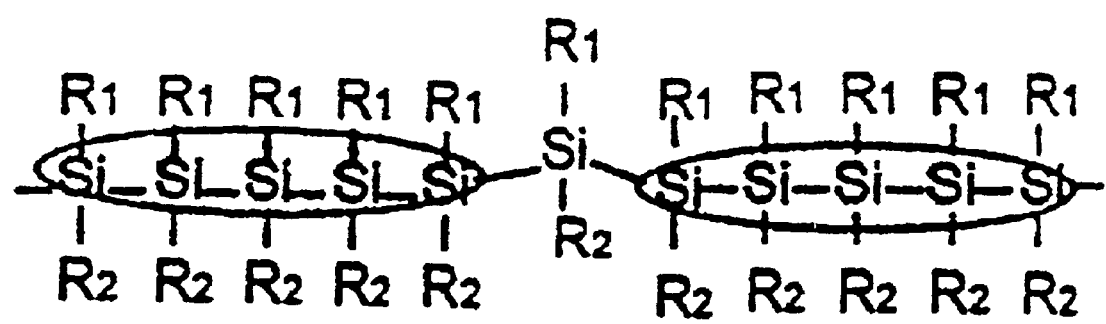
FIG. 12 is a structural formula of an organic polysilane.

FIG. 11 is a sectional view of a sample. Here, an organic film 4 produced by forming an organic substance into a film is disposed on a single-crystal silicon substrate 2. In this embodiment, the thickness of the organic film 4 is designed as 11 nm. Various types of organic substances can be utilized for the organic film; one example is an organic polysilane. Organic polysilanes are one type of self-functionalizing material, and have properties based on one-dimensional excitons. For example, these properties include photoconductivity with a high hole mobility, high light-emitting characteristics, and a large non-linear optical effect, etc. In view of these properties, organic polysilanes appear to be a promising material for nano-opto-electronic elements. FIG. 12 is a structural formula of an organic polysilane; R1 and R2 indicate hydrocarbon groups.

Figure 13:
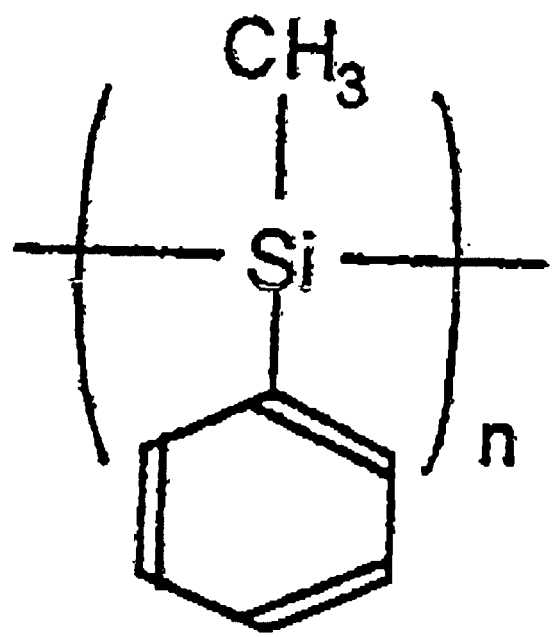
FIG. 13 is a structural formula of a PMPS (polymethylphenylsilane)

PMPS (polymethylphenylsilanes) are one type of organic polysilane; FIG. 13 shows the structural formula of PMPS. This is a polysilane in which R1 is a methyl group, and R2 is a benzene ring. The molecular weight varies according to the degree of polymerization, and it is generally around 30,000. An organic film 4 is formed by spin-coating the single-crystal silicon substrate 2 (heat-treated for 30 minutes at 150° C.) with a toluene solution of this PMPS.

Figure 14:
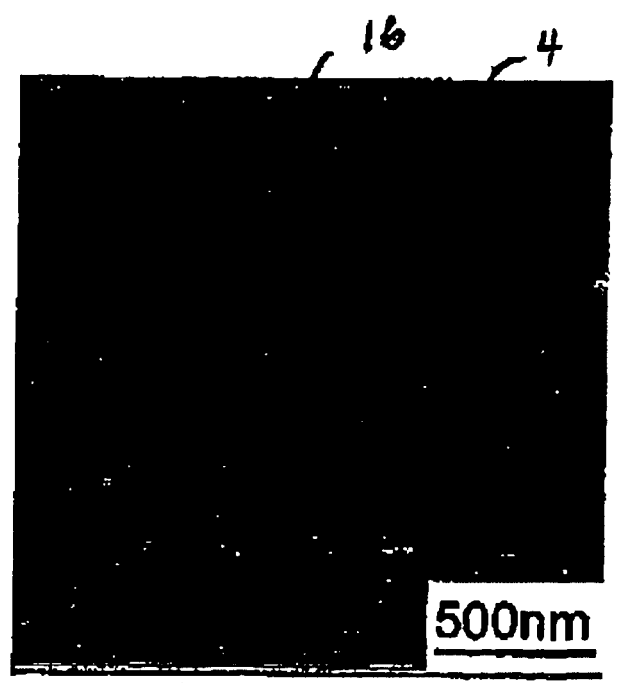
FIG. 14 is a photograph of a sample which has grooves formed by the lithographic method shown in FIG. 1.
Figure 15:
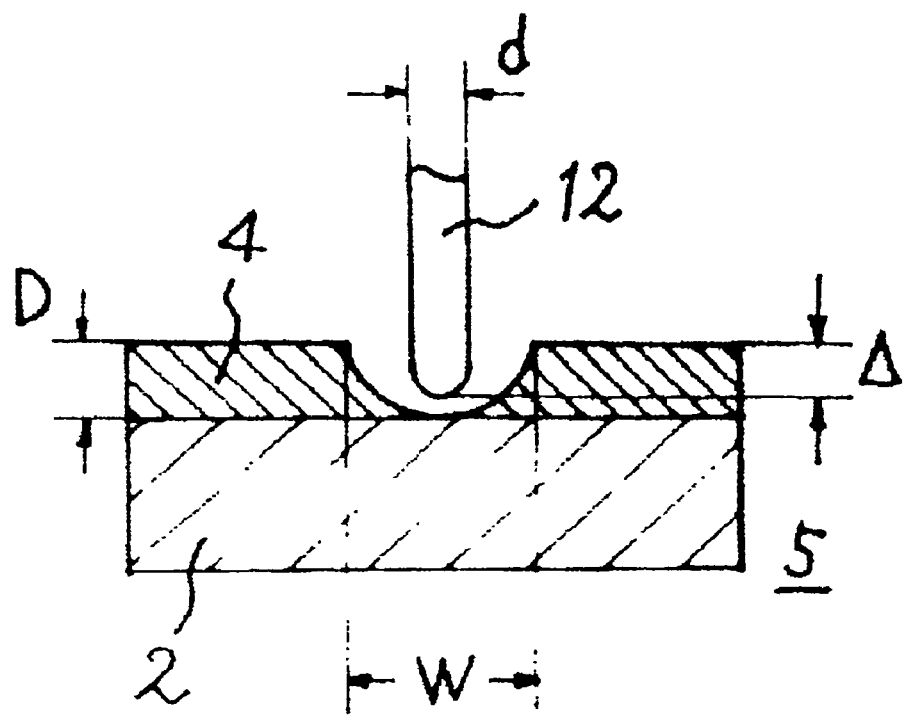
FIG. 15 is a sectional view of one of the grooves shown in FIG. 14.
Figure 16:
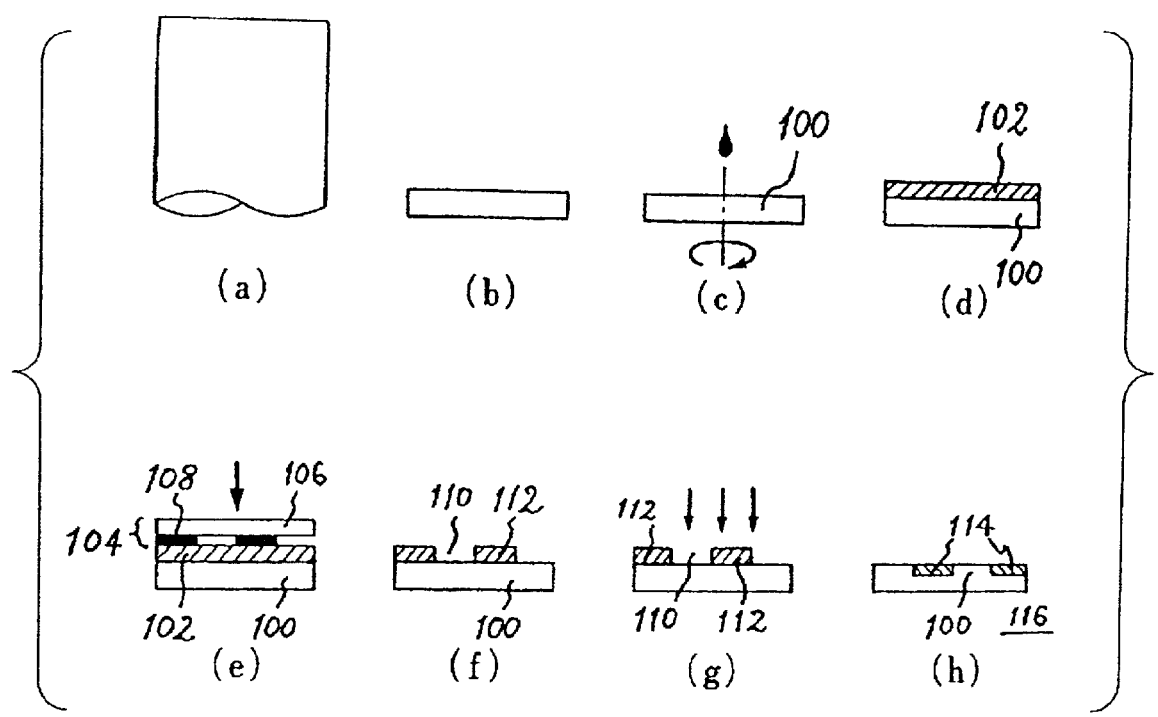
FIG. 16 shows a conventional lithographic method using a photoresist and mask.

FIG. 14 is a photograph of a sample of a substrate 2 with an organic film 4 which has grooves 16 formed by a lithographic method using the contact mode shown in FIG. 1. It is seen that grooves 16 are formed in the surface of the organic film 4. FIG. 15 is a sectional view of one of the grooves shown in FIG. 14. As a result of measurement by means of an AFM, it was formed that the groove width W was 70 nm, and the groove depth D was 11 nm. Furthermore, it was found that grooves 16 corresponding to the diameter of the nanotube could also be formed by means of a lithogrpahic method using the tapping mode.

In this lithographic method, the groove width W can be freely adjusted by using a nanotube with a small cross-sectional diameter d, i.e., a small tip end curvature radius. Since nanotubes have cross-sectional diameters d ranging from approximately one (1) nanometer to several tens of nanometers, the groove width W can also be adjusted from several nanometers to several hundred nanometers. Such ultra-fine nano-scale working (nano-lithography) is in a region that was completely unattainable in the past.

For purposes of comparison, an investigation was made in order to ascertain what kinds of grooves can be formed in cases where a carbon nanotube is not attached. An experiment was performed in which grooves were formed by means of the pyramid-form holder 8 of the AFM cantilever shown in FIG. 3. In the case of this silicon probe, a groove width W of approximately 850 nm was formed in the contact mode at a scanning speed of 0.05 ($\mu$m/s) and a bias voltage of −10 (V). Accordingly, the advantageous nature of nanotube tips was confirmed even in comparison with silicon probes. Furthermore, it was also confirmed that nanotubes have a long useful life.

The above comparative experiment indicates that an AFM cantilever can be used as an ultra-fine probe needle in a construction that is exactly the same as that of a nanotube tip. The polarity of the applied voltage is also the same. An experiment was also performed using an STM probe needle; in this case as well, a similar groove pattern was successfully formed. Accordingly, it was found that nano-size groove patterns can be formed if an ultra-fine probe needle with a nano-size tip end curvature radius is used.

The present invention is not limited to the above embodiment. Various modifications, design alterations, etc. within limits that involve no departure from the technical concept of the present invention are also included within the technical scope of the present invention.

As seen from the above, according to the present invention, nano-scale groove patterns, e.g., groove patterns ranging from several tens of nanometers to several hundred nanometers, can be formed in a sample surface by means of a nano-size ultra-fine probe needle. Accordingly, the increased density and increased speed of semiconductor chips can be achieved by the realization of nano-lithography.

Furthermore, the present invention makes it possible to realize conventionally unknown nano-lithography by using a nanotube with a tip end diameter of one (1) nanometer to several tens of nanometers. Furthermore, as a result of the high pliability of nanotubes, nano-lithography with a long useful life can be established.

In addition, since a cantilever commonly used in AFM can be used as an ultra-fine probe needle, inexpensive nano-lithography can be realized.

Furthermore, the present invention allows the reliable formation of a nano-scale groove pattern in an organic film by applying a voltage across the probe needle and organic film so that the probe needle acts as a cathode. Accordingly, nano-electronic devices can be realized.

In addition, the groove width and groove depth of the groove-form pattern can be freely adjusted merely by adjusting the scanning speed of the nanotube probe needle and the applied voltage. Thus, highly functional nano-lithography can be realized.

Furthermore, the present invention makes it possible to realize nano-lithography in electrical functional films, optical functional films, mask-forming films and resist films formed on substrates, so that nano-devices can be realized.

In addition, the present invention makes it possible to form a nano-scale groove pattern in a polysilane film. Accordingly, organic nano-opto-electronic devices that exhibit the physical properties of polysilanes can be realized.

What is claimed is:

1. A lithographic method to form groove-form patterns on a sample surface comprising the steps of:

preparing a nanotube probe that is formed by fastening a base end portion of a nanotube to a holder with a tip end portion of said nanotube being caused to protrude from said holder, causing a tip end of said tip end portion of said nanotube probe to contact a surface of a sample either continuously or intermittently, applying a voltage across said nenotube probe and said sample; and causing said nanotube probe to move while removing a substance that makes said sample at a tip end contact area by an application of said voltage, and wherein a groove width of and a groove depth of said groove of said groove-form pattern are controlled by adjusting a scanning speed of said nanotube probe and said applied voltage.

2. A lithographic method to form groove-form patterns on a sample surface comprising the steps of:

causing a tip end of a probe needle to contact a surface of a sample either continuously or intermittently, said probe needle being an ultra-line probe needle with a nano-size tip end diameter, applying a voltage across said probe needle and sample, and caushig said probe needle to move while removing a substance that makes said sample at a probe needle contact area by an application of said voltage, and wherein a groove width of and a groove depth of said groove of said groove-form pattern are controlled by adjusting a scanning speed of said probe needle and said applied voltage.

3. The lithographic method according to claim 2 or 1, wherein said holder is a pyramid portion of a cantilever for AFM use.

4. The lithographic method according to claim 2 or 1, wherein said sample is a lithographable matter including an organic film, other organic matter and an inorganic matter.

5. The lithographic method according to claim 4, wherein said organic film is one selected from the group consisting of an electrical or optical functional film, a mask-fimning film and a resist film tbrmcd on a substrate.

6. The lithographic method according to claim 4, wherein said organic film is a polysilane film.

* * * * *